(12) United States Patent
Suzuki

(10) Patent No.: US 7,349,065 B2
(45) Date of Patent: Mar. 25, 2008

(54) EXPOSURE APPARATUS AND DEVICE FABRICATION METHOD

(75) Inventor: Masayuki Suzuki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/853,974

(22) Filed: May 26, 2004

(65) Prior Publication Data

US 2004/0239906 A1   Dec. 2, 2004

(51) Int. Cl.
G03B 27/68   (2006.01)
G03B 27/42   (2006.01)
G03B 27/54   (2006.01)

(52) U.S. Cl. .............................. 355/52; 355/53; 355/67
(58) Field of Classification Search ................. 355/52, 355/53, 55, 67; 356/399, 400, 401; 250/548
See application file for complete search history.

(56) References Cited

U.S. PATENT DOCUMENTS

| | | | |
|---|---|---|---|
| 5,142,132 A | 8/1992 | MacDonald et al. | |
| 5,202,748 A | 4/1993 | MacDonald et al. | |
| 5,635,722 A * | 6/1997 | Wakamoto et al. | 250/548 |
| 6,359,678 B1 | 3/2002 | Ota | |
| 6,480,262 B1 | 11/2002 | Tanaka et al. | |
| 2002/0006561 A1* | 1/2002 | Taniguchi | 430/22 |
| 2002/0041368 A1* | 4/2002 | Ota et al. | 355/55 |
| 2003/0002023 A1 | 1/2003 | Bunau et al. | 355/67 |
| 2003/0003383 A1 | 1/2003 | Van Der Werf et al. | 430/22 |
| 2003/0128344 A1* | 7/2003 | Nishi | 355/52 |
| 2004/0189963 A1* | 9/2004 | Ohsaki | 355/53 |
| 2005/0146703 A1 | 7/2005 | Der Werf et al. | 355/67 |

FOREIGN PATENT DOCUMENTS

| EP | 0 779 528 | 6/1997 |
|---|---|---|
| EP | 1 089 327 | 4/2001 |

(Continued)

OTHER PUBLICATIONS

English translation for Japanese Patent Application Laid-Open No. 2000-286191.
Patent Abstracts of Japan for JP 2001-326160.

(Continued)

*Primary Examiner*—Peter B. Kim
(74) *Attorney, Agent, or Firm*—Morgan & Finnegan, LLP

(57) ABSTRACT

An exposure apparatus according to one aspect of the present invention includes an illumination optical system for illuminating, in a slit-shaped illumination area, a pattern of a reticle with a light from a light source, a projection optical system for projecting an image of the pattern onto a wafer, the projection optical system including a mirror, a detection system for detecting a positional offset of a light spot while the wafer is exposed with the image, and a drive unit for driving an optical element of the projection optical system, while the wafer is exposed with the image based on the positional offset detected by the detection system, wherein the detection system includes a light source for emitting a detection light beam, and a light-receiving device for receiving the light spot of the detection light beam via the projection optical system, and wherein the light source is located at a position substantially equivalent to the wafer, the light-receiving device is located at a position substantially equivalent to the reticle, and the light source emits the detection light beam from the outside of the image.

10 Claims, 8 Drawing Sheets

FOREIGN PATENT DOCUMENTS

| | | |
|---|---|---|
| JP | 11-219900 | 8/1999 |
| JP | 2000-286191 | 10/2000 |
| JP | 2001-326160 | 11/2001 |
| JP | 2003-31490 | 1/2003 |
| KR | 2002-0096984 | 12/2002 |
| WO | 03/017004 | 2/2003 |

OTHER PUBLICATIONS

Patent Abstracts of Japan for JP 2001-31490.
Korean Patent Office, Office Action dated Apr. 27, 2006 with English Translation.
EPO Search Report dated Mar. 29, 2006 for corresponding European patent application No. 04012646.8.

* cited by examiner

EXPOSURE APPARATUS AND DEVICE FABRICATION METHOD

This application claims a benefit of a foreign priority based on Japanese Patent Application No. 2003-154908, filed on May 30, 2003, which is hereby incorporated by reference herein in its entirety as if fully set forth herein.

BACKGROUND OF THE INVENTION

The present invention relates to an exposure apparatus that uses a projection optical system that uses a mirror, to manufacture semiconductors and liquid crystals.

Known as the projection optical system that uses a mirror are an unit magnification mirror optical system for liquid crystals, a reduction catadioptric optical system for excimer-laser exposure, and a multilayer catoptric optical system for extreme ultraviolet ("EUV") exposure.

For example, Japanese Patent Application, Publication No. 11-219900 (corresponding to U.S. Pat. No. 6,359,678) discloses a configuration for correcting image's positional offsets, a projection magnification, etc. in this mirror including projection optical system. This reference adjusts offsets in position and magnification by driving a reticle stage in an optical-axis direction.

Japanese Patent Application, Publication No. 2000-286191 discloses an exposure apparatus that includes a reticle surface deformation mechanism provided on a reticle holder, measures distortion of an image transferred onto a wafer via a projection optical system, drives an absorption pin provided at a portion that generates the distortion on a pattern surface on the reticle held by the reticle holder based on the measurement result, and deforms the reticle in an optical-axis (or a Z-axis) direction.

In general, any vibration in an optical element in an exposure optical system leads to minute shaking at an image position. More specifically and disadvantageously, vibrations that move a surface in an optical-axis direction lead mainly to vibrations at a focus position, and vibrations that incline the surface leads to an image position in a wafer surface.

A lens and a mirror have different amounts of the image vibrations, although the offset depends upon conditions. For simplicity, a description will be given of a comparison between one mirror and one single thin lens. When the mirror or the single lens offsets by a minute amount in a direction perpendicular to the optical axis, an image's positional offset is approximately the same as the offset of the mirror or single lens. On the other hand, when the mirror or single lens inclines by a fine angle $\epsilon$ around a surface vertex, and an exit angle of light incident upon the surface vertex offsets by $2\epsilon$ for the mirror but almost zero for the lens before and after the inclination.

When one mirror or a single lens that is used for almost unit magnification imaging changes its position by a fine amount $\Delta z$ in the optical-axis direction, the image-point position offsets by a fine amount $2\Delta z$ in the optical-axis direction for the mirror but the offset is approximately zero in the optical-axis direction for the lens.

Thus, the optical system that includes a mirror produces the image's positional offset, which would not occur in a lens due to self-corrections, although the offset depends upon conditions. In particular, when there are mixed vibrations that move a surface in the optical-axis direction and that incline the surface around the vertex, the mirror produces more remarkable image's offsets than the lens.

The image's vibrations caused by the mirror's vibrations are negligible in a conventional exposure mirror optical system, because of a relatively large critical dimension of a pattern to be exposed. However, a catoptric optical system, such as one for the EUV light, exposes a pattern with a much smaller critical dimension than the conventional one, and the smaller critical dimension enhances influence of the vibrations, preventing an improved resolution.

As a solution for this problem, a proposal by Japanese Patent Application, Publication No. 11-219900 requires driving of the reticle stage in scan and optical-axis directions and thus possibly results in vibrations of the reticle stage itself. In addition, when the vibrations propagate to an optical system, such as a mirror, the optical performance deteriorates. On the other hand, a method disclosed in Japanese Patent Application, Publication No. 2000-286191 mechanically deforms the reticle, causing distortions in the reticle. In addition, it is difficult to deform the reticle into a desired shape and to precisely project an image of a desired shape at a desired magnification.

BRIEF SUMMARY OF THE INVENTION

Accordingly, it is an object of the present invention to provide an exposure apparatus that can precisely expose an image of a desired shape (or a pattern) at a desired magnification.

An exposure apparatus of one aspect according to the present invention includes a detection system for detecting a positional offset of an image of a pattern formed by a projection optical system that includes a mirror. The projection optical system is to project the pattern of an object illuminated by an illumination optical system, onto a plate.

DETAILED DESCRIPTION OF THE PREFERRED EMBODIMENTS

Figure 1:
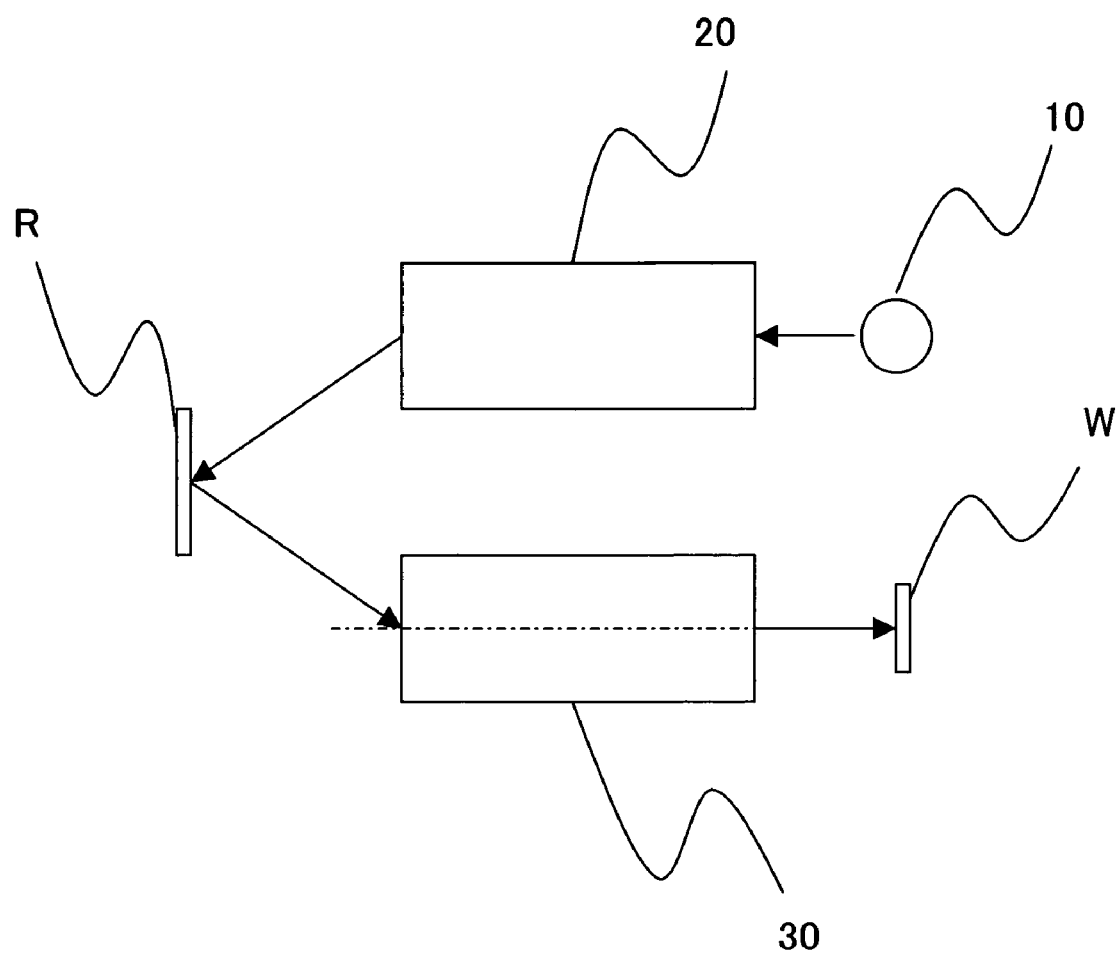
FIG. 1 is a sectional structure of an exposure apparatus of one embodiment according to the present invention.
Figure 2:
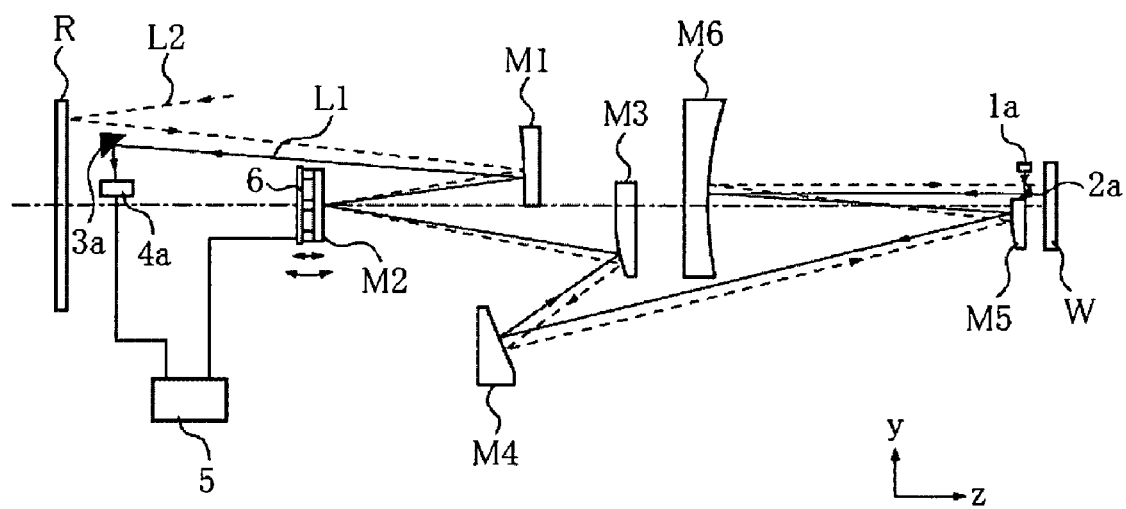
FIG. 2 is a view near a projection optical system in the exposure apparatus shown in FIG. 1

A description will be given of a reflection type exposure apparatus of one embodiment according to the present invention, with reference to the accompanying drawings. FIG. 1 is a view of the exposure apparatus of the embodiment according to the present invention. More specifically, FIG. 1 shows a schematic view of principal part of the exposure apparatus that uses the EUV light having a wavelength of about 13.5 nm. FIG. 2 is a view of a projection optical system in the exposure apparatus shown in FIG. 1, viewed from one direction.

A description will now be given of elements relating to exposure. The exposure apparatus shown in FIG. 1 includes an illumination optical system 20 for illuminating a reflection reticle R (as an object) with EUV light emitted from a EUV light source 10, and a projection optical system 30 for introducing the reflected light from the reflection reticle R to a wafer W (as a plate to be exposed). As shown in FIG. 2, the projection optical system 30 includes six mirrors M1, M2, M3, M4, MS and M6 in order from the reflection reticle R side along an optical path from the reflection reticle R to the wafer W. These mirrors M1, M2, M3, M4, MS and M6 have concave, concave, convex, concave, convex and concave shapes, respectively, and a multilayer for reflecting the EUV light is applied to each mirror. While these six mirrors have concave, concave, convex, concave, convex and concave shapes in the instant embodiment, the mirror M1 closest to the reticle R may have a convex shape and these mirrors can use other various combinations. While the number of mirrors is six in the instant embodiment, it may be eight or other numbers.

In FIG. 2, EUV light L2 emitted form the light source 10 and exited from the illumination optical system 20 is turned to illumination light having an arc slit-shaped illumination area by the illumination optical system, and enters the reflection reticle R that forms a multilayer for reflecting the EUV light and a pattern made of a material for absorbing (or transmitting) the EUV light. The configuration of the instant embodiment introduces the light reflected on the reticle R to the projection optical system and then the wafer W surface. Of course, the light that reaches the wafer W may be part of the light that passes through the reticle R.

The EUV light reflected on the reflection reticle R is sequentially reflected, as shown by a broken line, on the mirrors M1, M2, M3, M4, M5 and M6 to which the multilayer is applied, and then introduced into the wafer W. Thus, a reduced-size of a slit-shaped image as part of the pattern formed by the reflection part on the reticle R is formed on the wafer W.

The reticle R and wafer W are respectively scanned in a Y direction in the figure relative to the EUV light so that a scan speed ratio becomes approximately the same as the imaging magnification. As a result, an entire pattern on the reticle R is exposed on the wafer W.

A description will now be given of elements in a system for detecting an image position. In FIG. 2, 1a is a semiconductor laser light source (as a detection light source) arranged at a position substantially equivalent to the wafer W. 2a is a deflective mirror at a wafer side. 3a is a deflective mirror at the reticle R side. 4a is a photosensor (or a light-receiving sensor), arranged at a position equivalent to the reticle R, for detecting an image position. Preferably, the semiconductor laser light source 1a, and the photosensor 4a for detecting the image position are arranged at a side opposite with respect to all the optical elements in the projection optical system. It is also preferable that the semiconductor laser light source 1a is arranged on a reduction conjugate side (or the wafer W side) of the projection optical system, and the photosensor 4a for detecting the image position is arranged at an enlargement conjugate side (or the reticle R side). The semiconductor laser light source 1a does not have to be directly arranged at a position substantially equivalent to the wafer W, and an imaging optical system can be used so that a light source image of the semiconductor laser light source 1a is formed at a position substantially equivalent to the wafer W. The instant embodiment arranges the light source at a position "substantially" equivalent to the wafer, for example, as in a case where the imaging optical system forms an image of the semiconductor laser light source at a position equivalent to the wafer W.

Figure 3:
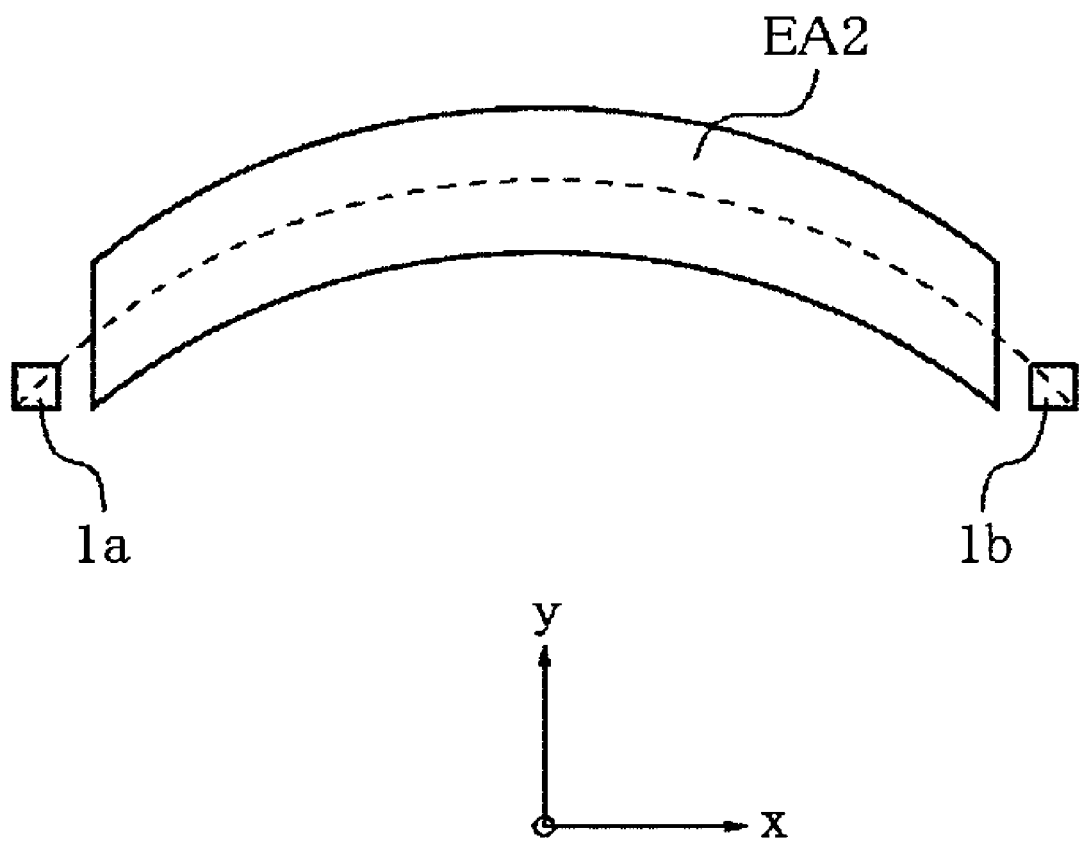
FIG. 3 is a view showing a positional relationship between an exposure area and a semiconductor laser light source on an image surface.

A description will be given of an arrangement of the semiconductor laser light source 1a on the wafer W surface, with reference to FIG. 3. FIG. 3 is a view showing a positional relationship between the exposure area and the semiconductor laser light source on the wafer surface W. The inside EA2 in the arc-shaped area in FIG. 3 is an area to be exposed by the EUV light. The laser light source is located outside the exposure area EA2, so as not to shield the exposure light. Preferably, it is located outside one or both longitudinal directions of the exposure area (or slit) as illustrated. Of course, plural ones may be provided at one end or at both ends.

FIG. 3 sets a position of a semiconductor laser light source 1a onto a circle (enclosed by a broken line in FIG. 3) that has an origin at an optical axis of the projection optical system and a radius corresponding to an image height at the center part of the slit width. If possible, the semiconductor laser light source 1a is preferably located directly on the image surface. However, it is difficult in many occasions to arrange the semiconductor laser light source 1a on the actual image surface. Accordingly, the deflective mirror 2a is arranged closer to the wafer W side than the mirror M6 as a final reflective surface, and the light from the semiconductor laser light source 1a arranged at a position equivalent to the image surface (or a wafer surface) is entered into the projection optical system via the deflective mirror 2a.

FIG. 3 arranges another semiconductor laser source 1b in addition to the semiconductor laser source 1a. Thus, the precision improves with plural light sources arranged at both sides of the exposure area. A deflective mirror 2b (not shown) similar to the deflective mirror 2a will be used when the light source 1b is used.

Figure 4:
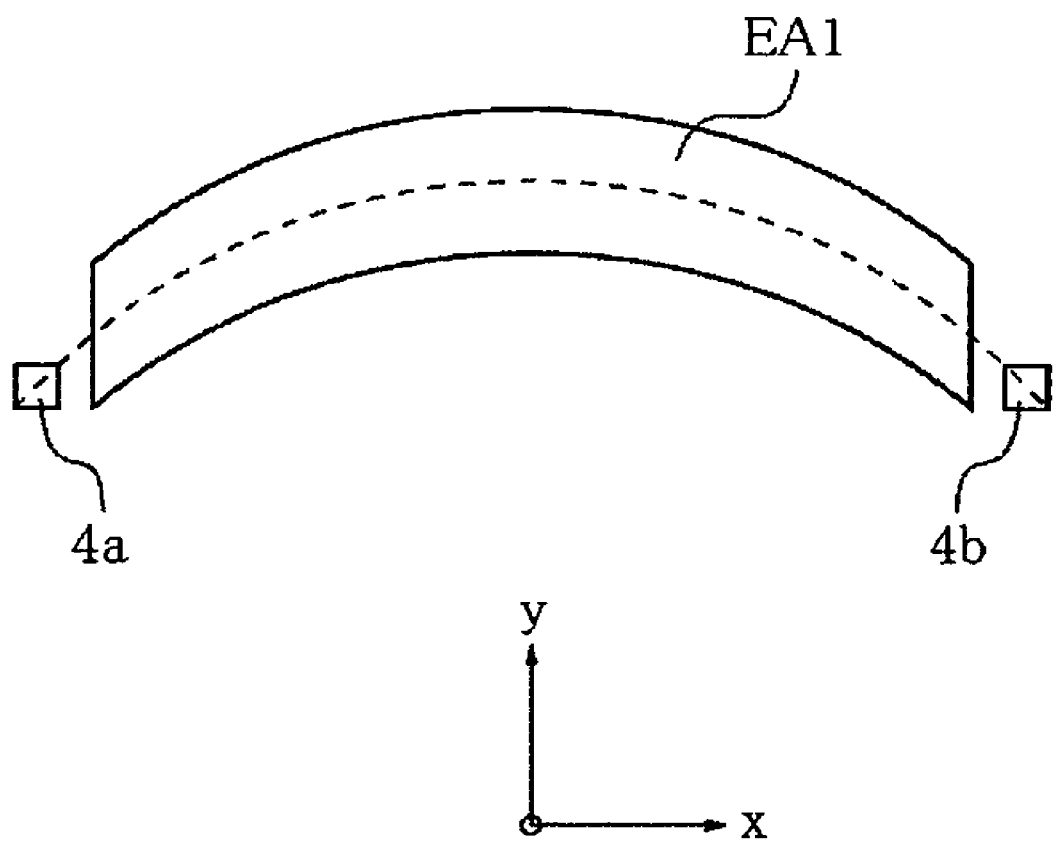
FIG. 4 is a view showing a positional relationship between an exposure light irradiation area and a photosensor on an object surface.

The image-position detecting photosensor is arranged similar to the light source. A description will be given of an arrangement of the photosensor 4a on the reticle R surface, with reference to FIG. 4. FIG. 4 is a view of a positional relationship between the illumination area of the exposure light and the photosensor on the reticle R surface. In FIG. 4, the inside EA1 of the arc-shaped (illumination) area is an area used for the EUV exposure. The sensor is arranged outside the exposure light illumination area EA1 so as not to shield the exposure light. FIG. 4 shows a circle (enclosed by a broken line), which has an origin at the optical axis of the optical system and a radius of an object height at the center part of the slit width. If possible, the sensor 4a is actually arranged on the object surface (or the reticle R surface). However, it is difficult to directly arrange the sensor 4a on the object surface in many occasions. Therefore, it is arranged at a position equivalent to the object surface, using the deflective mirror 3a.

FIG. 4 arranges the photosensor 4b in addition to the photosensor 4a. Plural sensors, as used herein, would improve the precision. A deflective mirror 3b (not shown) similar to the deflective mirror 3a will be used when the sensor 4b is used.

Figure 5A:
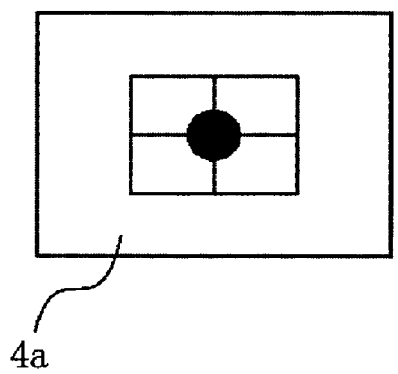
FIG. 5 is a view of an illustrative photosensor.
Figure 5B:
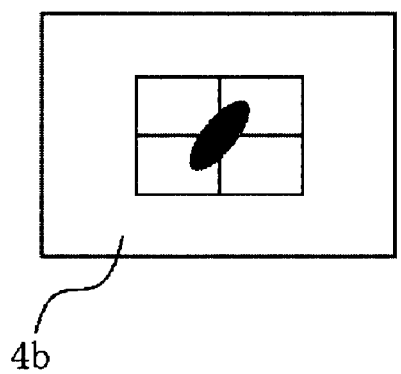

The sensor 4a can use a four-split sensor, for example, as shown in FIG. 5. When the light spot offsets in a direction orthogonal to the optical axis, each divided sensor receives the different amount of light and any offset and an offset amount can be detected. A sensor that includes a cylindrical lens and uses an astigmatism manner provides an elliptical light spot when a focus position shifts as shown in FIG. 5B. Therefore, an offset of the light spot in the optical-axis direction or an offset of the focus position can be detected in addition to the offset in the direction orthogonal to the optical axis. While the instant embodiment uses the four-split sensor, the present invention is not limited to the four-split sensor and a sensor having more divided portions can be used.

In FIG. 2, 5 is a controller or control unit for controlling a mirror driver 6 based on data output from the sensors 4a and 4b. As illustrated, the mirror driver 6 is attached to the second mirror M2 and configured to move the mirror M2 in the optical-axis direction and incline the mirror M2 around the surface vertex by a fine amount.

Figure 6A:
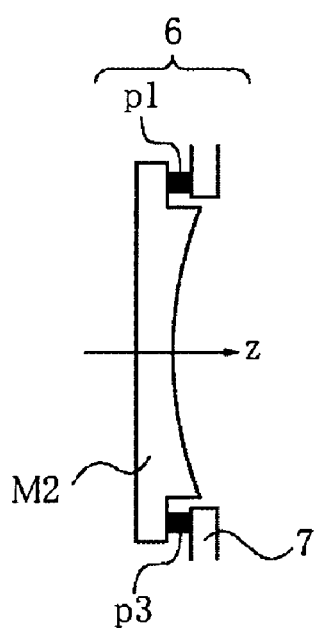
FIG. 6 is a view of a mirror driver.
Figure 6B:
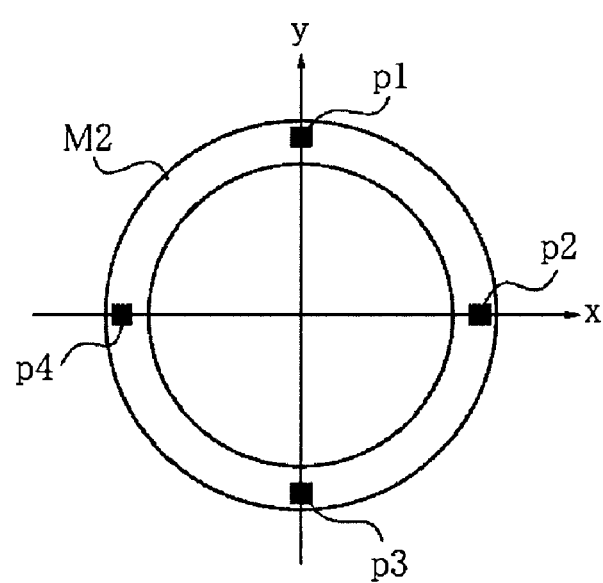

FIG. 6 more concretely shows the mirror driver 6 for driving the mirror M2. FIG. 6A is a sectional view of the mirror M2 and the mirror driver 6 taken along a surface that includes the optical axis. FIG. 6B is a view of an illustrative arrangement of piezoelectric elements in the driver 3 when the mirror M2 is viewed from the optical-axis direction.

Here, the instant embodiment uses a piezoelectric element for a drive mechanism (or an actuator) in the driver, the present invention is not limited to the piezoelectric element and may use other drive mechanism, such as one that uses a linear motor, a piston that uses helium gas, etc., and a linkage that uses a piezoelectric element.

In FIG. 6, p1 to p4 are piezoelectric elements, and 7 is a base member. The piezoelectric elements p1 to p4 make variable an interval between the mirror M2 and the base member 7. As illustrated, when the piezoelectric elements p1, p2, p3 and p4 are driven by the same amount in the same direction, the mirror M2 can be moved in the optical-axis direction. On the other hand, when the piezoelectric elements p1 and p3 (or p2 and p4 alternatively) are driven by the same amount in opposite directions, the mirror M2 can be inclined by a fine amount without changing a surface vertex position. Therefore, by providing the piezoelectric elements p1 to p4 with a certain combination of displacements, the mirror M2 can simultaneously receive a certain movement and a certain inclination. It is not necessary to arrange the piezoelectric elements (or driving elements, or mirrors or driven parts at mirror's supporters) at four points. For example, they can be arranged at three points at almost regular intervals in a rotating direction around the mirror's optical axis, or arranged at five points.

A description will now be given of a flow of detection and control of the image position.

In FIG. 2, the beam L1 emitted from the semiconductor laser light source 1a enters the optical path in the projection optical system after deflected by the deflective mirror 2a, and then proceeds in a direction reverse to the exposure light in the projection optical system. In other words, the beam L1 emitted from the semiconductor laser light source 1a is reflected in order of the mirrors M6, M5, M4, M3, M2 and M1. The semiconductor laser beam L1 that directs to the reticle R after reflected by the mirror M1 is reflected by the deflective mirror 3a in front of the reticle R, changes its traveling direction, enters the photosensor 4a arranged near a position equivalent to the reticle R, and forms the light spot on the photosensor 4a. The photosensor 4a detects a positional offset in a direction orthogonal to the optical axis of the light spot, and a positional offset to the optical axis direction (or a positional offset of focusing). The controller 5 controls driving of the mirror driver 6 by an amount to cancel the positional offset of the light spot, based on the information (or signal) output from the photosensor 4a.

Driving by the mirror driver 6 minutely inclines the mirror M2, and moves the mirror M2 by a minute amount in the optical-axis direction. As a result, a position of the light spot, i.e., the exposed image position, can be maintained at a predetermined position in a direction perpendicular to the optical axis and in the optical-axis direction. The above control is conducted in a shorter period than the exposure time during the exposure. Thereby, the positional offset caused by the mirror's vibrations can be effectively corrected.

When the drive amount for the mirror exceeds the preset drive range, the exposure can be configured to stop.

The embodiment thus adds, to the conventional optical system, a detection optical path from the semiconductor laser light source 1a to the photosensor 4a outside the optical path of the exposure light, and provides each mirror with a sufficiently large effective diameter of light, which can handle reflections of detection light.

The above embodiment arranges an optical path for detecting the image position in reverse order to the exposure by arranging a light source at the wafer side and a sensor at the reticle side. Since the imaging magnification of the detection optical system becomes an enlargement by this configuration, a position of the light spot can be comparatively easily detected. Alternatively, the optical path can follow the same order as the exposure.

For easy detections, an enlargement optical system can be added to the detection optical system, or an optical system in which the enlargement conjugate side faces the photosensor side can be arranged between the semiconductor laser light source and the photosensor. For example, after the enlargement optical system similar to a microscope's objective lens enlarges the light spot, the photosensor may detect the position.

While the above embodiment drives the second mirror M2, an element other than the second mirror can be driven or plural mirrors may be driven. According to the instant embodiment, a mirror whose reflection position of the exposure light L2 is the closest to the optical-axis position (or the mirror M2 in this case) is highly likely to have the smallest effective diameter. Thus, driving of the mirror becomes easy by driving a mirror whose reflection position of the exposure light L2 is the closest to the optical axis position.

While the instant embodiment exemplarily detects the positional offsets both in a direction orthogonal to the optical axis and in the optical-axis direction using one photosensor 4a, each sensor detect only one type of positional offset: For example, the photosensor 4a may detect the positional offset in the direction orthogonal to the optical axis, and the photosensor 4b may detect the positional offset in the optical-axis direction.

While the instant embodiment drives a mirror, a reticle (or a mask) and a wafer may be driven. In this case, instead of moving the light spot position to the predetermined position on the photosensor 4a, an amount of the positional offset of the image is inferred by always monitoring the spot's position and shape on the photosensor 4a, and the control drives reticle and wafer drivers (not shown) based on the information and cancel the image's positional offset.

While the instant embodiment correct the image's positional offsets both in the direction perpendicular to the optical axis and in the optical-axis direction, only one of them may be corrected.

The inventive optical system is not limited to one disclosed in the instant embodiment, but is applicable to various EUV optical systems, as well as any projection optical system that uses a mirror, such as a catadioptric projection optical system that uses a mirror and a excimer laser.

The exposure apparatus described in the above embodiment thus can prevent deteriorations of images due to vibrations, and provide high-quality exposure. The detector and corrector described in the instant embodiment can correct any change to the image position due to the heat and other variations in addition to the vibrations.

Figure 7:
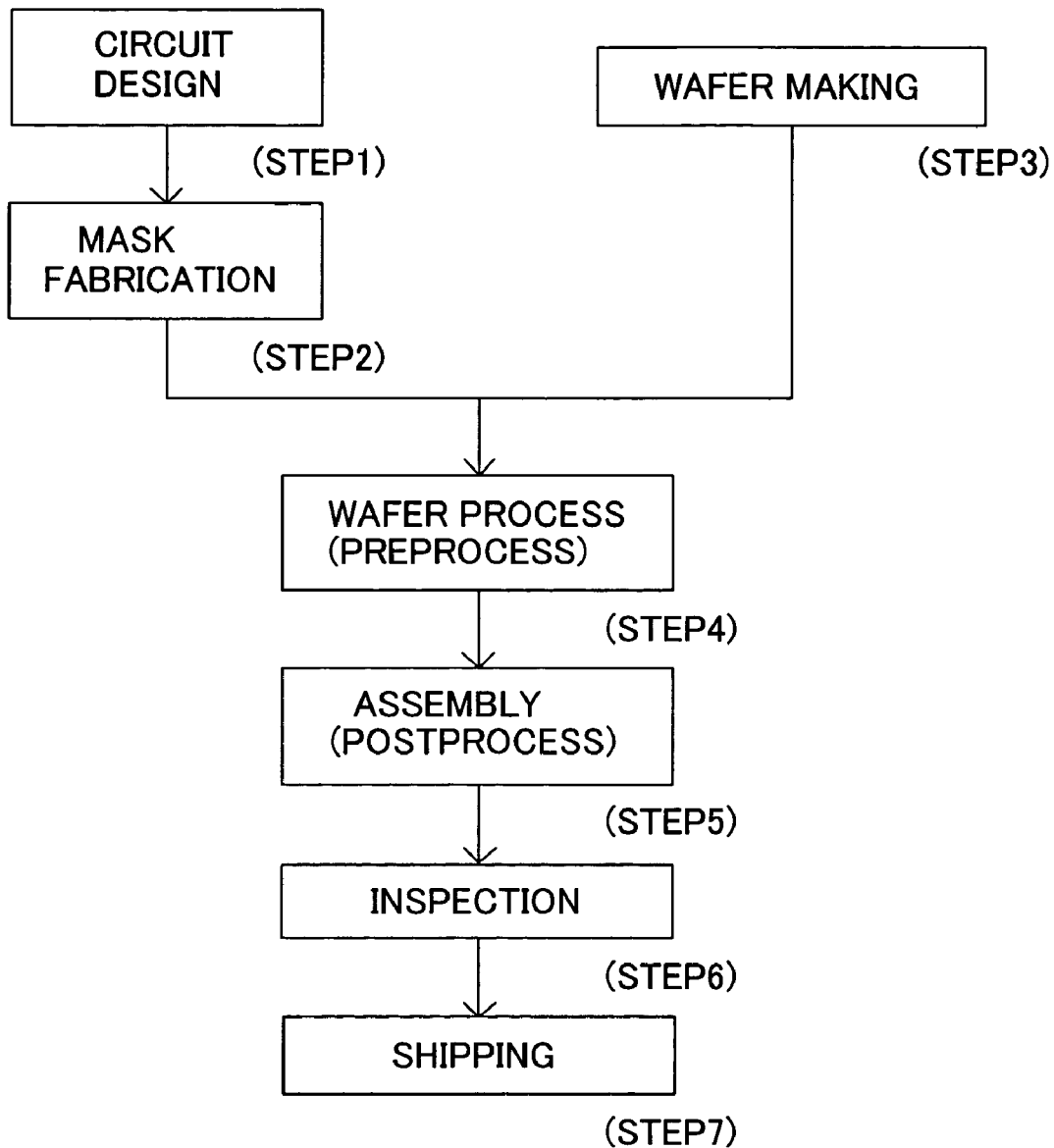
FIG. 7 is a flowchart for explaining a method for fabricating devices (semiconductor chips such as ICs, LSIs, and the like, LCDs, CCDs, etc.).
Figure 8:
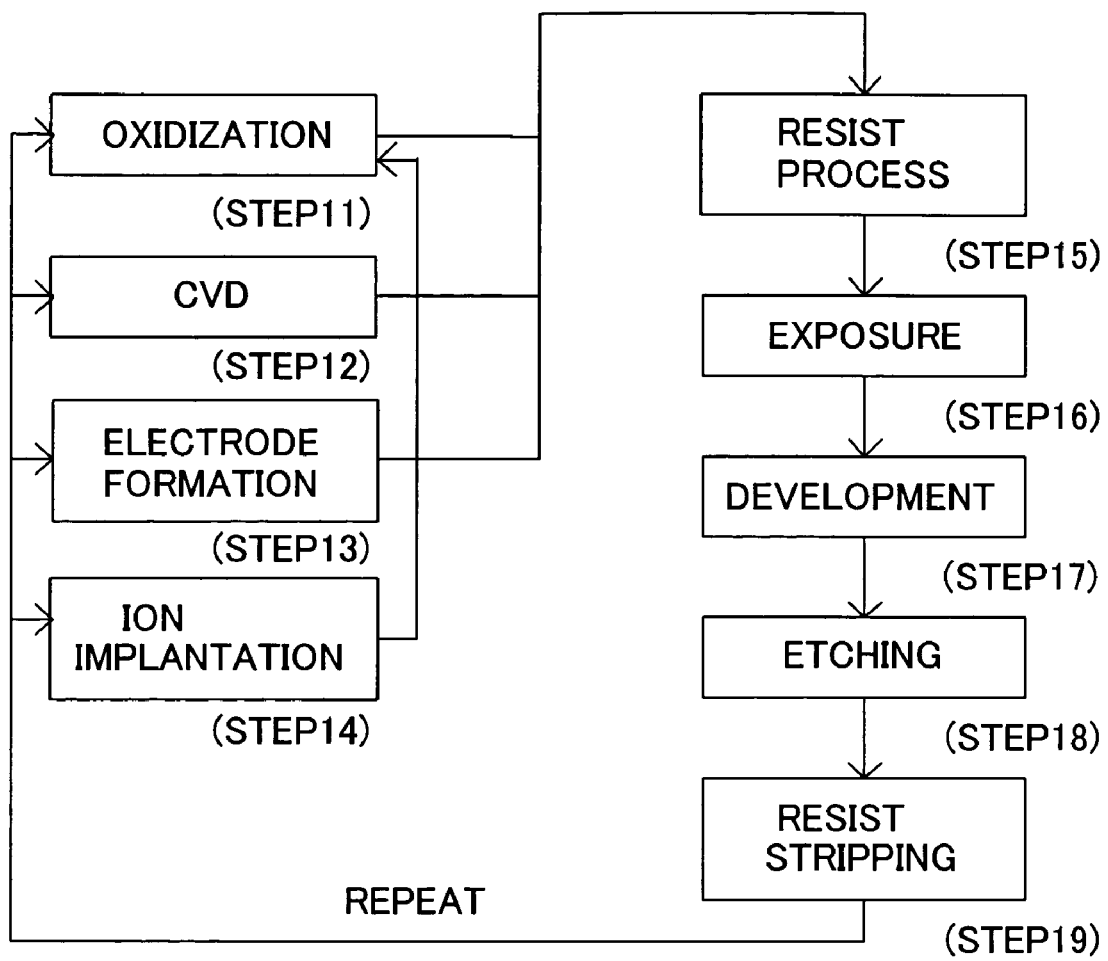
FIG. 8 is a detailed flowchart for Step 4 of wafer process shown in FIG. 7.

Referring to FIGS. 7 and 8, a description will now be given of an embodiment of a device fabricating method using the above exposure apparatus.

FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, transforms the wafer formed in Step 4 into a semiconductor chip and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus, and the devices as finished goods also constitute one aspect of the present invention.

What is claimed is:

1. An exposure apparatus comprising:
    an illumination optical system for illuminating, in a slit-shaped illumination area, a pattern of a reticle with exposure light from an exposure light source;
    a projection optical system for projecting an image of the pattern onto a wafer, said projection optical system including a mirror;
    a detection system for detecting a positional offset of a light spot while the wafer is exposed with the image; and
    a drive unit for driving an optical element of the projection optical system, while the wafer is exposed with the image based on the positional offset detected by the detection system,
    wherein said detection system includes a detection light source for emitting a detection light, and a light-receiving device for receiving the light spot of the detection light via the projection optical system, and
    wherein the detection light source is located at a position substantially equivalent to the wafer, the light-receiving device is located at a position substantially equivalent to the reticle, and the detection light source emits the detection light from the outside of the image.

2. An exposure apparatus according to claim 1, wherein said exposure apparatus exposes an entire image of the pattern onto the wafer by scanning the reticle and the wafer relative to the light.

3. An exposure apparatus according to claim 1, wherein said optical element has the smallest effective diameter among optical elements in said projection optical system.

4. An exposure apparatus according to claim 1, wherein said projection optical system includes plural mirrors having a common optical axis, and the optical element is a mirror whose reflective position of exposure light is closest to the optical axis.

5. An exposure apparatus according to claim 1, wherein the light from the light source has a wavelength of 20 nm or smaller.

6. A device fabrication method comprising the steps of:
    applying resist onto a wafer;
    exposing a pattern on a mask onto the wafer to which the resist is applied, using an exposure apparatus according to claim 1; and
    developing the wafer that has been exposed.

7. An exposure apparatus according to claim 1, wherein the drive unit drives the position of the optical element of the projection optical system at a time period shorter than an exposure time period of the wafer.

8. An exposure apparatus according to claim 1, wherein a wavelength of the exposure light is different from that of the detection light.

9. An exposure apparatus comprising:
    an illumination optical system for illuminating, in a slit-shaped illumination area, a pattern of a reticle with exposure light from an exposure light source;
    a projection optical system for projecting an image of the pattern onto a wafer, said projection optical system including a mirror;
    a detection system for detecting a positional offset of a light spot while the wafer is exposed with the image; and
    a drive unit for driving a position of an optical element of the projection optical system, while a wafer is exposed with the image, based on the positional offset detected by the detection system
    wherein said detection system includes a detection light source for emitting a detection light, and a light-receiving device for receiving the light spot of the detection light via the projection optical system, and
    wherein the detection light source is located at a position substantially equivalent to the reticle, the light-receiving device is located at a position substantially equivalent to the wafer, and the detection light source emits the detection light from the outside of the illumination area.

10. An exposure apparatus according to claim 9, wherein a wavelength of the exposure light is different from that of the detection light.

* * * * *